US005311153A

United States Patent [19]

Lau et al.

[11] Patent Number: 5,311,153

[45] Date of Patent: May 10, 1994

[54] INTEGRATED WAVEGUIDE/STRIPLINE TRANSITION

[75] Inventors: James C. Lau, Torrance; Richard P. Malmgren, Rancho Dominguez; Kenneth Lui, Fountain Valley, all of Calif.

[73] Assignee: TRW Inc., Redondo Beach, Calif.

[21] Appl. No.: 917,633

[22] Filed: Jul. 17, 1992

[51] Int. Cl.[5] .................... H03H 5/00

[52] U.S. Cl. .................... 333/26; 333/33

[58] Field of Search .................... 333/26, 33, 24.8, 204, 333/246, 21 R

[56] References Cited

U.S. PATENT DOCUMENTS

| | | | |
|---|---|---|---|
| 4,434,409 | 2/1984 | Green | 333/248 |
| 4,550,296 | 10/1985 | Ehrlinger et al. | 333/26 |
| 4,742,571 | 5/1988 | Letron | 333/26 |
| 4,754,239 | 6/1988 | Sedivec | 333/26 |
| 4,758,922 | 7/1988 | Ishigaki et al. | 333/219 |
| 4,901,040 | 2/1990 | Ahlborn et al. | 333/246 |
| 5,184,095 | 2/1993 | Hanz et al. | 333/33 |
| 5,237,296 | 8/1993 | Mandai et al. | 333/204 |

*Primary Examiner*—Raymond A. Nelli

*Attorney, Agent, or Firm*—Ronald L. Taylor

[57] ABSTRACT

An integrated waveguide/stripline signal transition structure and method for fabricating the same are provided for allowing high frequency signal transitions. The signal transition structure includes a waveguide which has a conductive cavity for guiding electromagnetic waves therethrough. A first conductive circuit layer is fabricated within the conductive cavity and is electrically connected thereto. A second conductive signal layer is fabricated within the conductive cavity and is isolated from the conductive cavity and the first conductive signal layer. A plurality of dielectric layers are provided which suspend the first and second conductive signal layers within the conductive cavity. The second conductive signal layer and the conductive cavity thereby allow for signal transitions therebetween. The first and second conductive signal layers and dielectric material are integrally fabricated on top of a removable material which is subsequently removed. In an alternate embodiment, a single dielectric layer is provided for suspending the first and second conductive signal layers. In addition, an array of signal transition structures may be integrally fabricated within a housing structure.

20 Claims, 3 Drawing Sheets

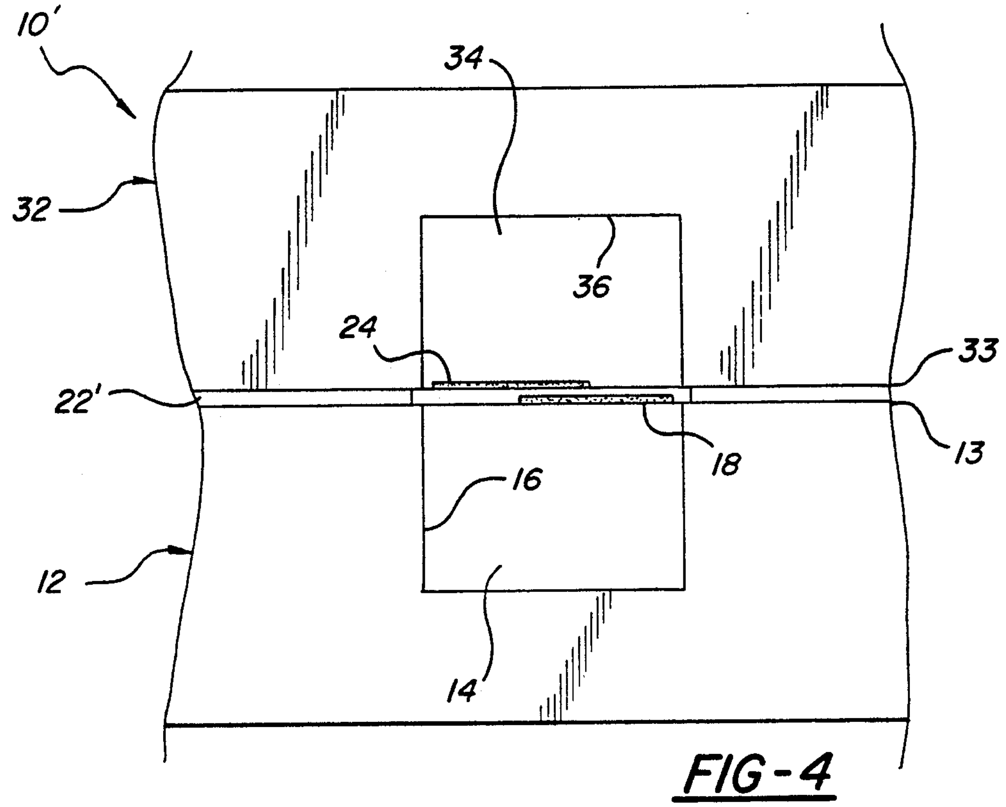
FIG-4
FIG-5
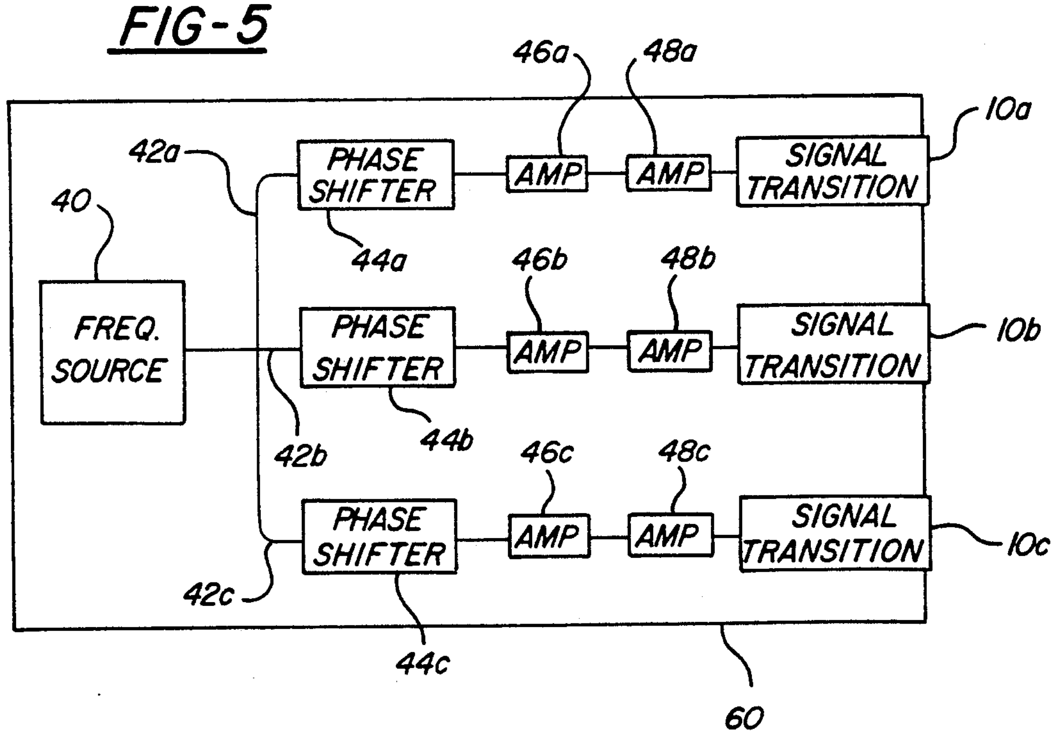

INTEGRATED WAVEGUIDE/STRIPLINE TRANSITION

BACKGROUND OF THE INVENTION

1. Technical Field

This invention relates generally to high frequency microwave integrated circuitry and, more particularly, to integrated high frequency waveguide/stripline signal transitions.

2. Discussion

High frequency microwave systems frequently require signal transitions between a waveguide and a conductive stripline or microstrip. Microwave systems sometimes require adequate signal transitions from a stripline or microstrip to a waveguide for purposes of launching or transmitting signals therefrom. Likewise, microwave systems may further require adequate signal transitions from a waveguide to a stripline or microstrip for purposes of receiving high frequency signals.

Conventional waveguide/stripline signal transition structures generally employ a waveguide and stripline as separate components. Making adequate signal transitions at increasingly higher frequencies is increasingly difficult using the existing conventional waveguide/-stripline signal transition structures. For instance, for frequencies approaching 75 GHz or higher, rectangular waveguide dimensions are generally required to be approximately 0.125 by 0.063 inches (0.30, 0.15 cm) or smaller. As a result, very high frequencies impose the requirement of very small waveguide dimensions. In addition, it is desirable to fabricate integrated circuits in a highly integrated manner to reduce the size and number of components that are required. The small waveguide dimensions which are required have made it increasingly difficult to provide for integrated fabrication of the waveguide with a stripline or microstrip.

It is therefore desirable to provide for an integrated waveguide/stripline signal transition structure with high frequency capabilities. It is further desirable to provide for a method of integrally fabricating a waveguide with a stripline to form an integrated signal transition structure. In addition, it is desirable to provide for a plurality of waveguide/stripline signal transition structures integrally fabricated together. Furthermore, it is desirable to provide for such an array of signal transition structures fabricated integrally in conjunction with other circuit components.

SUMMARY OF THE INVENTION

In accordance with the teachings of the present invention, an integrated waveguide/stripline signal transition structure and method for fabricating the same are provided. The signal transition structure includes a waveguide which has a conductive cavity for guiding electromagnetic waves therethrough. A first conductive signal layer is fabricated within the conductive cavity and electrically connected thereto. A second conductive signal layer is fabricated within the conductive cavity and is isolated from the conductive cavity and the first conductive layer. Dielectric material is further provided which suspends the first and second conductive signal layers within the conductive cavity. The first and second conductive signal layers are fabricated on top of a removable material which is subsequently removed. In addition, an array of signal transition structures may be integrally fabricated within a housing structure.

BRIEF DESCRIPTION OF THE DRAWINGS

Other objects and advantages of the present invention will become apparent to those skilled in the art upon reading the following detailed description and upon reference to the drawings in which:

FIG. 4 is a cross-sectional view of a single waveguide/stripline signal transition structure fabricated in accordance with an alternate embodiment of the present invention; and FIG. 5 is a block diagram which illustrates an array of stripline to waveguide signal transitions which are integrally fabricated with additional circuit components in accordance with a signal transmission application.

DETAILED DESCRIPTION OF THE PREFERRED EMBODIMENT

Figure 1:
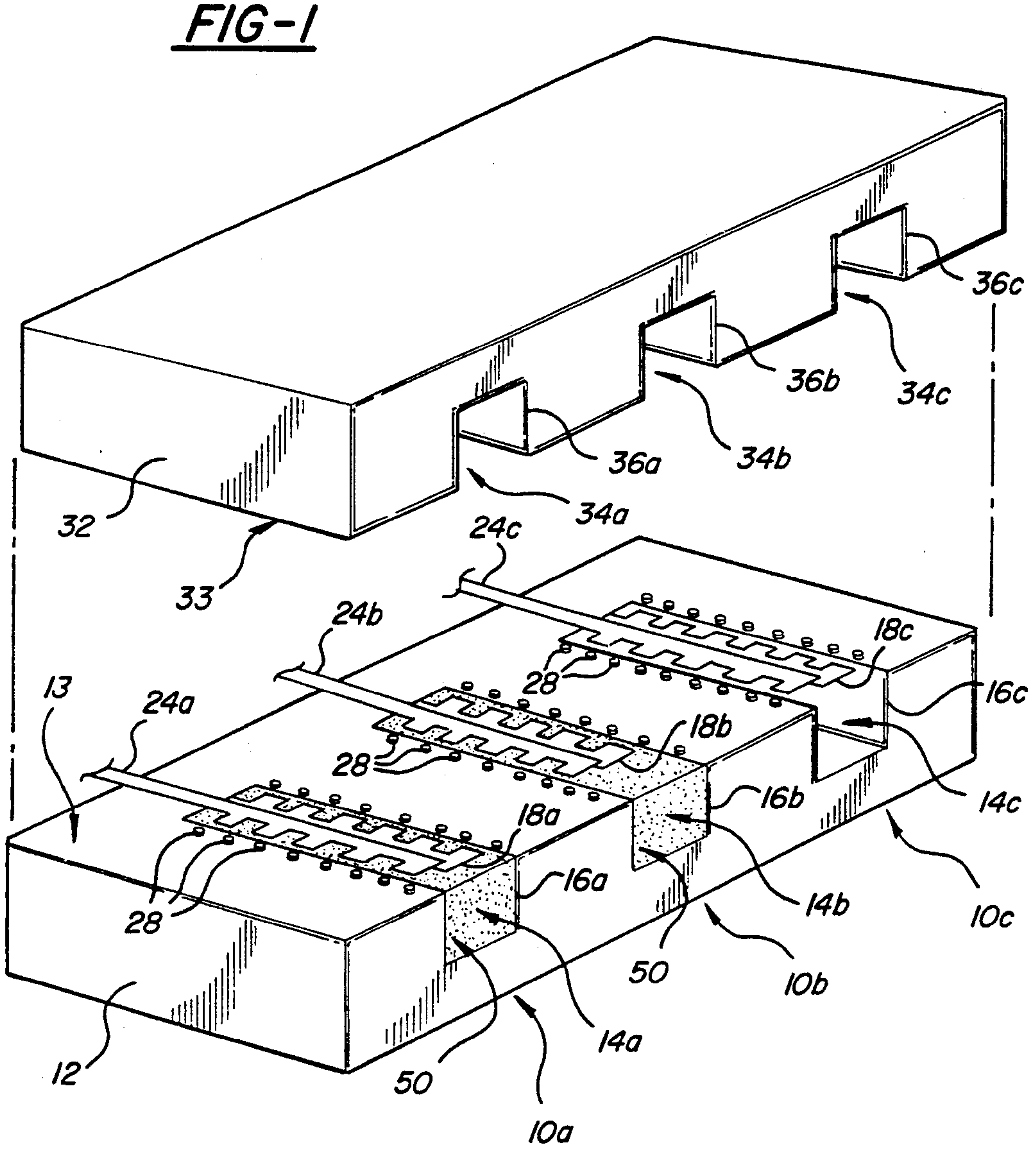
FIG. 1 is a schematic diagram which illustrates a plurality of waveguide/stripline signal transition structures fabricated in accordance with the present invention.

Turning now to FIG. 1, a plurality of integrally fabricated waveguide/stripline signal transition structures 10*a* through 10*c* are illustrated therein. Each of the signal transition structures 10*a* through 10*c* include a multi-layer thin film circuit suspended within a conductive cavity for communicating therewith. Each of the signal transition structures 10*a* through 10*c* are fabricated in a like manner within the same housing structure to form an array of signal transition structures 10*a* through 10*c*. While three signal transition structures 10*a* through 10*c* are shown herein, any number of signal transition structures may be fabricated in accordance with the teachings of the present invention.

The signal transition structures 10*a* through 10*c* are fabricated within a housing structure which includes a bottom member 12 and a top member 32. The bottom member 12 has an array of bottom conductive cavities 14*a* through 14*c* formed in the top side 13 thereof. The bottom conductive cavities 14*a* through 14*c* each have a conductive surface 16*a* through 16*c* which make up the bottom portion of conductive waveguide cavities. The bottom member 12 may be made up of aluminum, kovar, iron nickel alloy or other conductive material and is preferably coated with gold or copper. Alternatively, the bottom member 12 may be made up of non-conductive material such alumina, aluminum nitrate, diamond or other materials which have a conductive coating such as gold or copper plated or otherwise formed thereon.

The top member 32 of the housing structure has an array of upper conductive cavities 34*a* through 34*c* formed in the bottom side 33 thereof. The top conductive cavities 34*a* through 34*c* likewise each have a conductive surface 36*a* through 36*c* which forms the top portion of the conductive waveguide cavities. The top member 32, likewise, may be made of a conductive or non-conductive material such as that found in the bottom member 12 and has a conductive coating such as gold or copper formed thereon.

The top member 32 is mounted directly above the lower member 12 so that the upper conductive cavities 34*a* through 34*c* are aligned with the bottom conductive cavities 14*a* through 14*c*. As such, the top and bottom conductive cavities 34*a* through 34*c* and 14*a* through 14*c* form the array of conductive waveguide cavities. A thin multi-layer circuit is fabricated in a suspended structure within the mid-portion of each conductive waveguide cavity so that a conductive stripline feed in the multi-layer circuit forms a coupling with the conductive waveguide cavity associated therewith. A plurality of conductive vias 28 are connected between each of the top and bottom members 32 and 12 of the housing structure to ensure electrical contact therebetween.

Figure 2:
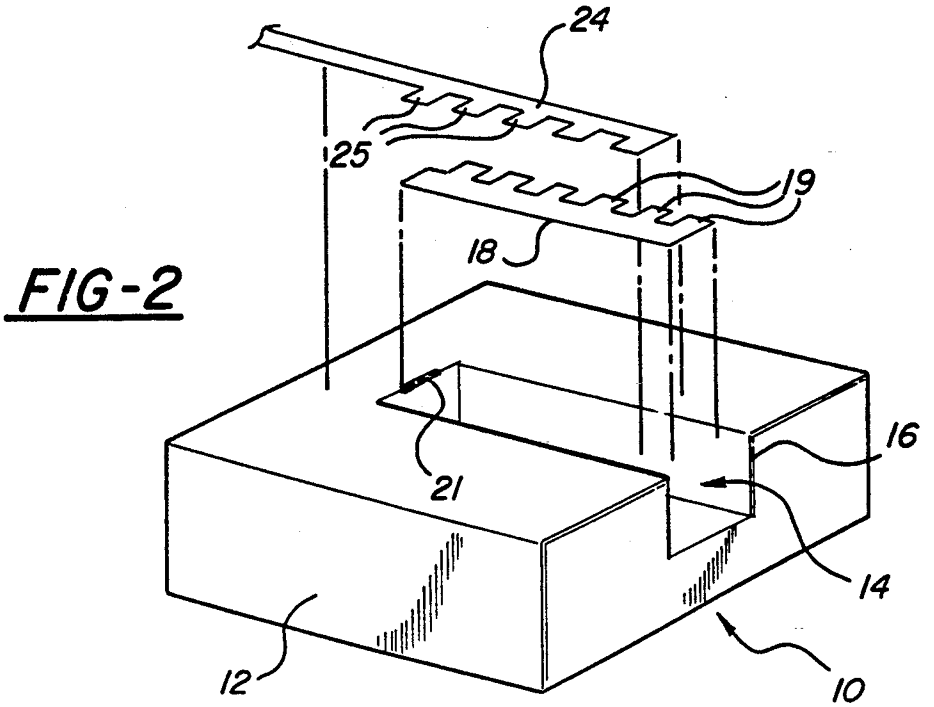
FIG. 2 is an exploded view of a portion of a single waveguide/stripline signal transition structure fabricated in accordance with the present invention.

An exploded view of one of the waveguide/stripline signal transition structures 10 is shown in FIG. 2. The thin multi-layer circuit includes a first conductive signal layer 18 fabricated below a second conductive signal layer 24. The first and second conductive signal layers 18 and 24 are stripline or microstrip feed lines. The first conductive signal layer 18 includes an array of conductive fingers 19 which are suspended within the conductive waveguide cavity. The first conductive signal layer 18 is connected to the conductive surface 16 of the conductive waveguide cavity 14 via electrical connection 21. As a result, the first conductive signal layer 18 forms a ground reference in relation to the second conductive signal layer 24.

The second conductive signal layer 24 is fabricated above the first conductive signal layer 18 and isolated therefrom. In addition, the second conductive signal layer 24 is further isolated from the bottom member 12 and top member 32. The second conductive signal layer 24 has an array of conductive fingers 25 which are also suspended within the conductive waveguide cavity. The second conductive signal layer 24 is separate and isolated from the first conductive signal layer 18 by a controlled thickness dielectric material. As such, the second conductive signal layers 24 forms an electrical coupling with the conductive waveguide cavity to allow for signal transitions therebetween.

Figure 3:
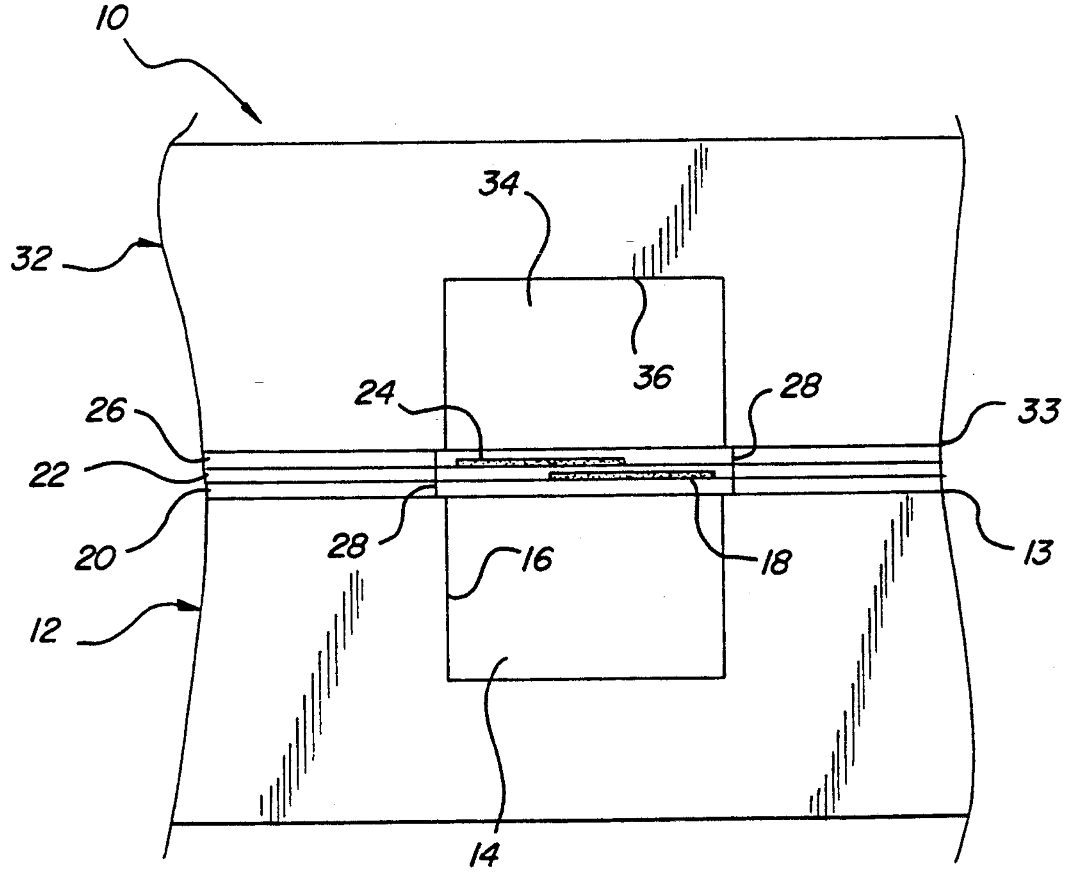
FIG. 3 is a cross-sectional view of a single waveguide/stripline signal transition structure fabricated in accordance with the present invention.

FIG. 3 illustrates a cross-sectional view of a single fully fabricated waveguide/stripline signal transition structure 10. In fabricating the signal transition structure 10, the bottom conductive cavity 14 is formed in the top side 13 of the bottom member 12. A removable filler material 50 is placed in the bottom conductive cavity 14 so as to substantially fill the bottom conductive cavity 14. The removable filler material 50 may include removable wax, salt, or other known removable filler materials.

In the preferred embodiment, a low dielectric dissipation material is placed on the top surface 13 of the bottom member 12 to form a first dielectric layer 20. The first dielectric layer 20 covers the top surface of the bottom member 12 including the removable filler material 50 and thereby forms a suspended structure above the bottom conductive cavity 14. The first conductive signal layer 18 is fabricated on top of the first dielectric layer 20 above a portion of the bottom conductive cavity 14. A second dielectric layer 22 is disposed on top of the first conductive signal layer 18 and the first dielectric layer 20. The second conductive signal layer 24 is then fabricated on top of the second dielectric layer 22 above a portion of the bottom conductive cavity 14. The first and second conductive signal layers 18 and 24 are thin film conductive circuit layers or striplines which may be formed by conventional multi-layer film circuit fabrication techniques such as photolithographic techniques or other techniques known in the art.

An optional third dielectric layer 26 may be disposed on top of the second conductive signal layer 24 and the second dielectric layer 22. The first, second and third dielectric layers 20, 22 and 26 are formed with adequate dielectric layer thicknesses in accordance with preferred standards set forth for controlled impedance transmission lines. In particular, the second dielectric layer 22 provides adequate controlled isolation between the first and second conductive signal layers 18 and 24. The dielectric layers 20, 22 and 26 may include Benzocyclobutene (BCB) or other dielectric material which may be spread in a desired thickness.

The first, second and third dielectric layers 20, 22, and 26 and the first and second conductive signal layers 18 and 24 make up the multi-layer thin film circuit which is suspended in the middle portion of the conductive waveguide cavity. The first, second and third dielectric layers 20, 22 and 26 essentially form a suspended structure which suspends the first and second conductive signal layers 18 and 24 within the conductive waveguide cavity. The multi-layer thin film circuit further includes a plurality of openings (not shown) which receive a plurality of conductive vias 28.

The removable filler material 50 is subsequently removed from the bottom conductive cavity 14 after the suspended circuit structure is adequately formed. The removal of the removable filler material 50 may be accomplished by conventional techniques known in the art. For instance, if removable wax is used, heat may be applied to the bottom conductive cavity 14 so as to melt the wax thereby allowing the wax to drain from the bottom conductive cavity 14. Alternately, if removable metal salts are used, the salt filler may be dissolved and flushed away with water or other appropriate solvents. In any event, the removable filler material 50 is removed thereby leaving behind an open bottom conductive cavity 14 with a circuit structure suspended thereabove.

An upper conductive cavity 34 is formed in the bottom side 33 of the top member 32 of the housing structure in a manner similar to the formation of the bottom conductive cavity 14. The top member 32 is placed on top of the bottom member 12 so that the top side 13 of the bottom member 12 faces the bottom side 33 of the top member 32. In addition, the top conductive cavity 34 is positioned substantially directly above the bottom conductive cavity 14. Together the top conductive cavity 34 and bottom conductive cavity 14 form a conductive waveguide cavity which allows high frequency electromagnetic signals to propagate therein. The top conductive cavity 34 is further connected to the bottom conductive cavity 14 with the conductive vias 28 to provide electrical contact therebetween.

In an alternate embodiment, the signal transition structure 10′ may be fabricated as shown in FIG. 4 without the first dielectric layer 20. In doing so, the first conductive signal layer 18 is fabricated on top of the removable filler material 50. A dielectric layer 22′ is disposed on top of said first conductive signal layer 18, the removable filler material 50 and the top side 13 of the bottom member 12. The second conductive signal layer 24 is then fabricated on top of the dielectric layer 22′. In the alternate embodiment, the removable filler material 50 is preferably removed from the bottom conductive cavity 14 after the first and second signal layers 18 and 24 are formed about the dielectric layer 22'. The dielectric layer 22' in effect forms the suspended structure which suspends the first and second conductive layers 18 and 24 within the conductive waveguide cavity. In addition, an optional dielectric layer (not shown) may be disposed on top of the second conductive signal layer 24 as shown in the preferred embodiment.

In operation, the waveguide/stripline signal transition structure 10 may be used as a waveguide to stripline transition for transmitting or launching high frequency signals. An example of an integrated signal transmitter is shown in FIG. 5. A frequency source 40 generates a high frequency signal which is transmitted via three transmission lines 42*a*, 42*b* and 42*c*. Each of transmission lines 42*a* through 42*c* includes a phase shifter 44*a* through 44*c* for providing desired phase shifts therein. In addition, each of the transmission lines 42*a* through 42*c* include a pair of amplifiers 46*a* through 46*c* and 48*a* through 48*c* which amplify the phase shifted signals. The amplified phase shifted signals are then provided to each of the stripline to waveguide transition structure 10*a* through 10*c*. In doing so, the stripline or second conductive signal layer 24 receives the amplified phase shifted signal which produces a resonating electromagnetic signal in the conductive waveguide cavity. The induced electromagnetic signal may then be transmitted from the waveguide to remote electrical devices as desired.

The integrated transmission application as shown in FIG. 5 may be fabricated within a single housing structure 60. As such, the signal transition structures 10*a* through 10*c* are fabricated within the housing structure 60. In addition, the frequency source 40, phase shifters 44*a* through 44*c* and amplifiers 46*a* through 46*c* and 48*a* through 48*c* are likewise integrally fabricated within the housing structure 60.

Similarly, the waveguide/stripline signal transition structure 10 may be used as a waveguide to stripline transition for receiving incoming signals. In doing so, the waveguide to stripline signal transition structure 10 would receive the incoming signals within the conductive waveguide cavities. The electromagnetic signals would then induce electrical signals on the second conductive signal layers 22. The second conductive signal layers 22 may further be coupled to receivers and other circuit components to provide desired operations.

While this invention has been described in connection with three waveguide/stripline signal transition structures 10*a* through 10*c*, any number of signal transition structures may be integrated within the bottom and top members 12 and 32 of the housing structure. In addition, while the first and second conductive stripline signal layers 18 and 24 are shown with a finger like arrangement, any number of circuit pattern may be employed for communicating with the conductive waveguide cavity.

In view of the foregoing, it can be appreciated that the present invention enables the user to achieve an integrated waveguide/stripline signal transition structure and method for fabricating the same. Thus, while this invention has been disclosed herein in connection with a particular example thereof, no limitation is intended thereby except as defined by the following claims. This is because the skilled practitioner will recognize that other modifications can be made without departing from the spirit of this invention after studying the specification and drawings.

What is claimed is:

1. A high frequency signal transition structure comprising:

a waveguide having a conductive cavity with conductive inner walls for guiding electromagnetic waves therethrough;

a first conductive signal layer suspended within said conductive cavity and electrically connected thereto; and a second conductive signal layer extending into said conductive cavity and isolated from the conductive inner walls of the conductive cavity and said first conductive layer so as to form a coupling between said first conductive signal layer and said waveguide.

2. The signal transition structure as defined in claim 1 further comprising:

a top housing with a top conductive channel formed in a bottom surface thereof and a bottom housing with a bottom conductive channel formed in a top surface thereof, said top and bottom conductive channels facing each other to form said conductive cavity;

a first dielectric layer disposed at least partially between said top and bottom housings and between said first and said second conductive signal layers for providing isolation therebetween and further suspending said first and second conductive signal layers; and a plurality of conductive vias extending through said first dielectric layer and electrically connecting said top and bottom conductive channels.

3. The signal transition structure as defined in claim 2 further comprising:

a second dielectric layer disposed on the bottom side of said first conductive signal layer.

4. The signal transition structure as defined in claim 3 further comprising:

a third dielectric layer disposed on top of said second conductive signal layer.

5. The signal transition structure as defined in claim 1 wherein a plurality of said signal transition structures are integrally fabricated within a common housing structure.

6. The signal transition structure as defined in claim 5 wherein said plurality of signal transitions are integrally fabricated with other circuit components within said common housing structure.

7. The signal transition structure as defined in claim 1 wherein said conductive cavity comprises a bottom housing with a bottom conductive channel and a top housing with a top conductive channel, wherein said top and bottom conductive channels face each other and are electrically connected via conductor means.

8. The signal transition structure as defined in claim 1 wherein said second conductive signal layer comprises a stripline.

9. A high frequency waveguide/stripline signal transition structure comprising:

a waveguide having a conductive cavity including a top conductive channel formed in a bottom surface of an upper housing and a bottom conductive channel formed in a top surface of a lower housing and arranged below said top conductive channel for guiding electromagnetic waves therethrough; and a thin multi-layer circuit suspended within said conductive cavity of said waveguide between said upper and lower housings, said multi-layer circuit comprising;

a first conductive signal layer which is electrically coupled to said conductive cavity;

a second conductive signal layer which is isolated from said first conductive signal layer and said conductive cavity so as to form a coupling between said first conductive signal layer and said waveguide;

a dielectric layer disposed at least partially between said upper and lower housings and between said first and second conductive signal layers for providing isolation therebetween and further suspending said circuit within said conductive cavity; and a plurality of conductive vias extending through said dielectric layer and electrically connecting said top and bottom conductive channels.

10. The signal transition structure as defined in claim 9 further comprising a second dielectric layer disposed on the bottom side of said multi-layer circuit wherein said first and second dielectric layers suspend said multi-layer circuit within the mid portion of said conductive cavity.

11. The signal transition structure as defined in claim 9 wherein a plurality of said signal transition structures are integrally fabricated within a common housing structure.

12. The signal transition structure as defined in claim 9 wherein said second conductive signal layer comprises a stripline.

13. A method for fabricating an integrated waveguide/stripline signal transition structure, said method comprising:

forming a first conductive waveguide channel on the top side of a bottom housing;

depositing in said first conductive waveguide channel a removable filler material;

disposing a first layer of dielectric material on the top side of said bottom housing which covers said filler material;

forming a first conductive signal layer on top of said first layer of dielectric material above said first conductive waveguide channel and in electrical contact therewith;

disposing a second layer of dielectric material on top of said first layer of dielectric material and said first conductive signal layer;

forming a second conductive signal layer on top of said second layer of dielectric material and above said first conductive channel; and placing a second conductive waveguide channel above said first conductive channel and in electrical contact therewith so as to form a conductive waveguide cavity which encloses said first and second conductive signal layers.

14. The method as defined in claim 13 wherein said method further comprises fabricating a plurality of said waveguide/stripline signal transition structures within a common housing structure.

15. The method as defined in claim 13 further comprising the step of removing said filler material subsequent to the formation of said first and second conductive signal layers.

16. The method as defined in claim 13 further comprising the step of disposing a third layer of dielectric material on top of said second conductive signal layer.

17. A method for fabricating an integrated waveguide/stripline signal transition structure, said method comprising:

forming a first conductive waveguide channel on the top side of a bottom housing;

depositing in said first conductive waveguide channel a removable filler material;

forming a first conductive signal layer on top of said removable filler material above said first conductive channel and in electrical contact therewith;

disposing a layer of dielectric material on top of said first conductive signal layer and at least partially on a top surface of said bottom housing;

forming a second conductive signal layer on top of said layer of dielectric material and above said first conductive channel; and placing a second conductive waveguide channel above said first conductive channel and in electrical contact therewith so as to form a conductive waveguide cavity which encloses said first and second conductive signal layers.

18. The method as defined in claim 17 wherein said method comprises fabricating a plurality of said waveguide/stripline signal transition structures within a single housing structure.

19. The method as defined in claim 17 further comprising the step of removing said filler material subsequent to the formation of said first and second conductive signal layers.

20. The method as defined in claim 17 further comprising the step of forming a plurality of conductive vias electrically connecting the first conductive waveguide channel to the second conductive waveguide channel.

* * * * *